(12) United States Patent
Schneider et al.

(10) Patent No.: US 6,833,859 B1
(45) Date of Patent: Dec. 21, 2004

(54) METHOD OF LOCATING RADIO FREQUENCY LEAKS IN A CATV SYSTEM

(75) Inventors: Raymond J. Schneider, Harrisonburg, VA (US); Randy Estep, Harrisonburg, VA (US)

(73) Assignee: Comsonics, Inc., Harrisonburg, VA (US)

(*) Notice: Subject to any disclaimer, the term of this patent is extended or adjusted under 35 U.S.C. 154(b) by 0 days.

(21) Appl. No.: 09/491,592

(22) Filed: Jan. 25, 2000

Related U.S. Application Data

(60) Provisional application No. 60/118,107, filed on Feb. 1, 1999.

(51) Int. Cl.[7] ........................ H04W 17/00; H04W 17/02
(52) U.S. Cl. ........................ 348/192; 725/107; 455/67.1
(58) Field of Search ........................ 725/107, 9–21, 725/143; 348/192–193; 455/67.3, 67.1, 67.7; 324/67, 72; 342/126, 357.13, 357.18

(56) References Cited

U.S. PATENT DOCUMENTS

| | | | | |
|---|---|---|---|---|
| 3,828,306 A | * | 8/1974 | Angeloni | 340/990 |
| 4,072,899 A | * | 2/1978 | Shimp | 725/143 |
| 4,810,961 A | * | 3/1989 | Takahashi et al. | 324/95 |
| 5,140,307 A | * | 8/1992 | Rebetez et al. | 340/539.1 |
| 5,294,937 A | * | 3/1994 | Ostteen et al. | 342/459 |
| 5,557,282 A | * | 9/1996 | Mertens | 342/123 |
| 5,777,662 A | * | 7/1998 | Zimmerman | 725/125 |
| 6,005,518 A | * | 12/1999 | Kallina | 342/459 |
| 6,009,334 A | * | 12/1999 | Grubeck et al. | 455/456 |
| 6,018,358 A | * | 1/2000 | Bush | 725/125 |
| 6,272,350 B1 | * | 8/2001 | Tekinay | 455/506 |
| 6,307,593 B1 | * | 10/2001 | Bowyer et al. | 348/461 |
| 6,310,646 B1 | * | 10/2001 | Shi et al. | 348/194 |
| 6,313,874 B1 | * | 11/2001 | Bowyer et al. | 348/180 |

* cited by examiner

*Primary Examiner*—Vivek Srivastava
*Assistant Examiner*—Matthew Demicco
(74) *Attorney, Agent, or Firm*—Welsh & Katz, Ltd.

(57) ABSTRACT

A method and apparatus are provided for determining a source of a leakage signal from a distribution cable of a cable television distribution system. The method includes the steps of sampling the leakage signal from the distribution cable of the cable television distribution system at each of a plurality of geographic locations within an environs of the cable, forming a leakage signal profile relating each sample with a respective location of the plurality of geographic locations; and determining a source location of the leakage signal based upon the formed profile.

43 Claims, 6 Drawing Sheets

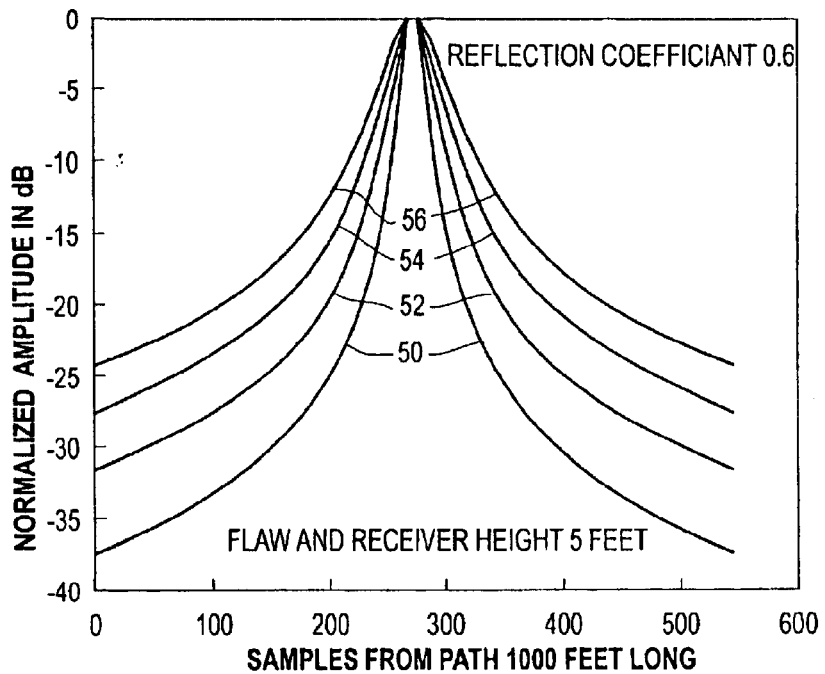
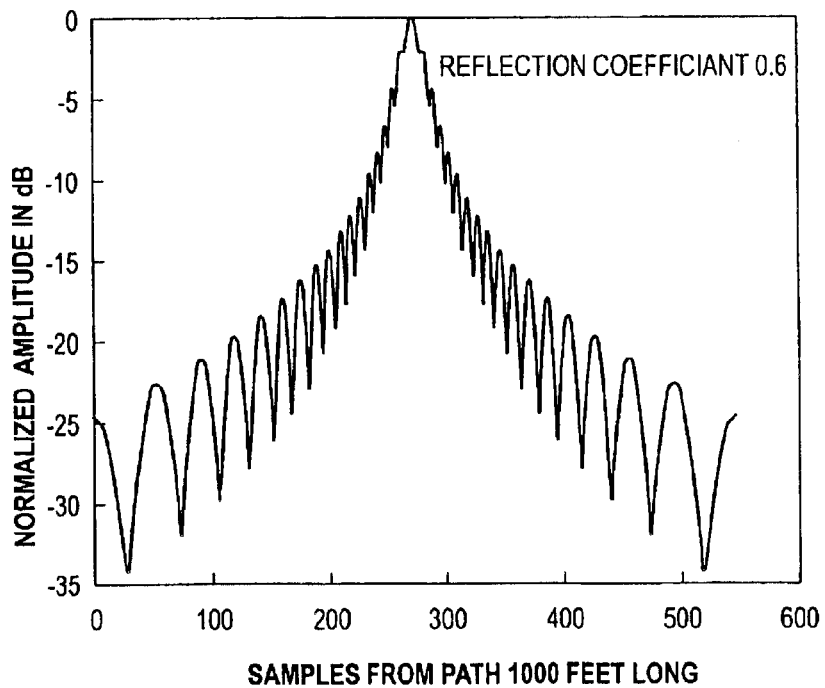

TWO NORTH PASSES GEOREFERENCED AND OFFSET

CONVOLUTION OF PIN WITH 20 M SILICA AROUND PEAK

FIG. 11
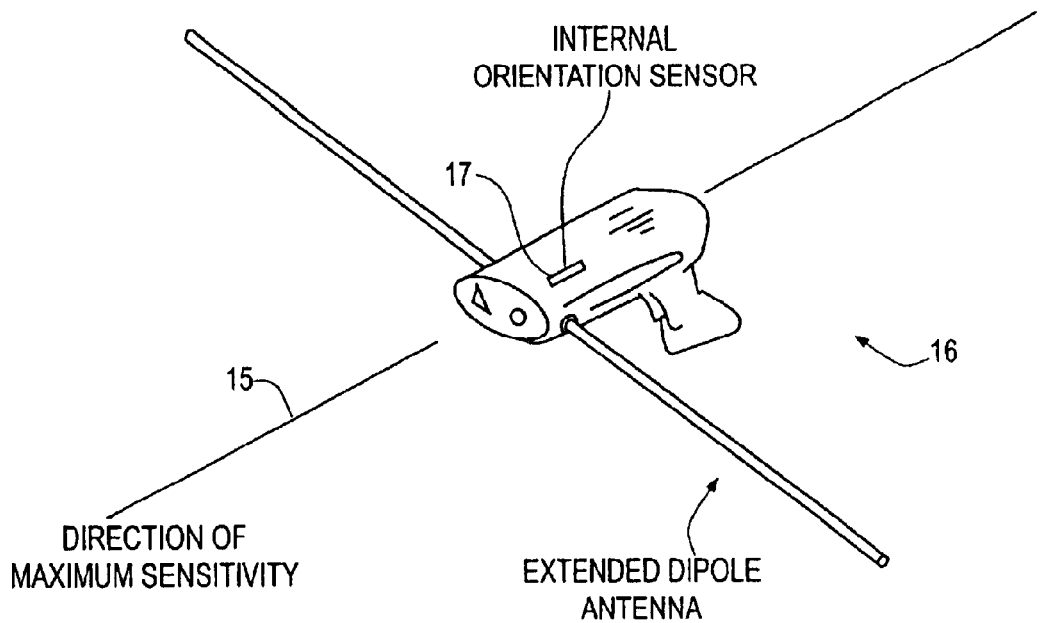
- INTERNAL ORIENTATION SENSOR
- 17
- 15
- 16
- DIRECTION OF MAXIMUM SENSITIVITY
- EXTENDED DIPOLE ANTENNA
1) SENSOR IS TURNED THROUGH AN ANGLE FROM ONE LOCATION
OVERHEAD VIEW
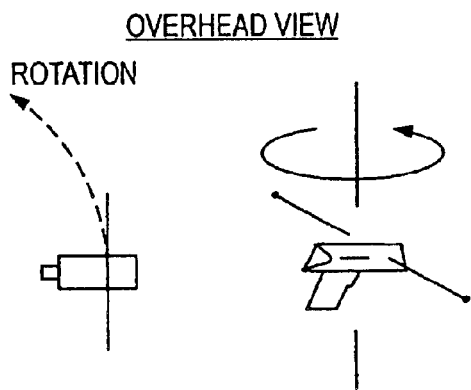
ROTATION
2) ORIENTATION HEADING SENSOR OUTPUT IS CORRELATED WITH DATA/LEAKAGE SENSOR
3) BEARING IS COMPUTED

METHOD OF LOCATING RADIO FREQUENCY LEAKS IN A CATV SYSTEM

This application claims the benifit of provisional application Ser. No. 60/118,107 filed Feb. 1, 1999.

FIELD OF THE INVENTION

The field of the invention relates to cable television systems and more particularly to the identification to radio frequency leaks in the distribution cables of such systems.

BACKGROUND OF THE INVENTION

Community antenna television (CATV) systems are known. Such systems typically receive television signals from a variety of sources (e.g., by satellite, land lines, production studios, etc.) and distribute such signals among their subscribers within a community.

Television signals provided to the CATV system are often provided under a hodgepodge of spectrally overlapping and non-overlapping formats. Often the signals must be spectrally relocated according to a local CATV frequency plan for purposes of re-transmission.

In general, CATV systems transmit television signals in a frequency range of from 50 to 71 GHz. Often individual television signals are assigned 6 MHz slots at predetermined locations within the range and separated one-from-another by a guard band.

CATV systems distribute their signals to subscribers almost exclusively through coaxial cable systems. Where distribution distances are long, amplifiers are periodically provided to elevate signals to an acceptable level.

While the existing methods of CATV signal distribution is effective, it has the potential to disrupt other communication systems. For example, airlines typically use the same frequency range for communicating with landing towers. Where significant radio frequency (rf) leaks exist, the potential for airline disasters is significant.

Recently the Federal Communications Commission (FCC) has mandated that CATV operators test their signal distribution system for rf leaks. However, reliable equipment and techniques for accomplishing this objective, for the most part, do not exist. Accordingly, a need exists for reliable methods of detecting rf leaks in CATV systems.

SUMMARY

A method and apparatus are provided for determining a source of a leakage signal from a distribution cable of a cable television distribution system. The method includes the steps of sampling the leakage signal from the distribution cable of the cable television distribution system at each of a plurality of geographic locations within an environs of the cable, forming a leakage signal profile relating each sample with a respective location of the plurality of geographic locations; and determining a source location of the leakage signal based upon the formed profile.

BRIEF DESCRIPTION OF THE DRAWINGS

FIG. 3 depicts sampling profiles that may be generated by the system of FIG. 1;

FIG. 4 depicts multi-path interference that may be used by the system of FIG. 1;

FIG. 11 depicts a dipole antenna used by the system of FIG. 1 under an alternate embodiment.

DETAILED DESCRIPTION OF A PREFERRED EMBODIMENT

Figure 1:
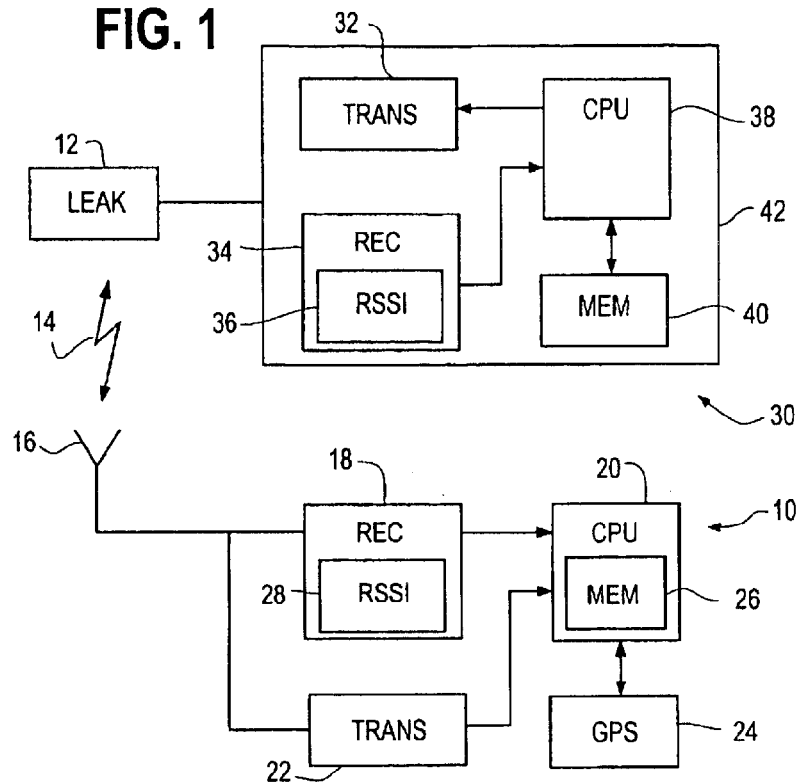
FIG. 1 depicts apparatus for detecting leaks shown in a context of use in accordance with an illustrated embodiment of the invention.

FIG. 1 is a block diagram of an rf leak detector system 10, generally in accordance with an illustrated embodiment of the invention. Under the illustrated embodiment, the detector system 10 may be portable and may be mounted within a vehicle (not shown) for purposes of profiling the leakage characteristics of a CATV system 30.

An rf leak 12 of the CATV system 30 may exist under any of a number of different formats (e.g., an impedance mismatch, a faulty connector, a break or fault in an rf shield, water penetrating a connector, etc). While the leak may exist under a number of different formats, the propagation of the energy from the leak may follow any of a number of paths and, in general, may be extremely complex.

For example, propagation of energy from an antenna designed for rf transmission is typically line-of-sight. Propagation of energy from an rf leak 12 of a CATV system 30 is seldom, if ever, line-of-sight.

CATV systems, by design, are intentionally and completely shielded. Because of the shield, line-of-sight transmission, for all practical purposes, does not exist. However, in context of a leak, an unintended de facto antenna may exist due to the interaction of the shield and surrounding structure. Where the shield is compromised, only a portion of the shield may be involved resulting in an asymmetric field of rf energy surrounding the leak 12. Because of the inherent anomalies in rf leaks, prior art triangulation is, for the most part, not an effective method of locating rf leaks.

Further, even where a leak could be directionalized, surrounding structures may reflect the signal, resulting in the perception that the leak is in another location. Multi-path interference, either from the ground or other buildings may combine to further complicate source localization.

While the term "direct path" may occasionally be used herein, it should be understood that the term is only meant to imply that signal energy which follows a relatively direct path from the de facto antenna to a receiver. Indirect path is that signal energy which may pass from the de facto antenna and be reflected from one or more obstacles within a surrounding environment.

Under the illustrated embodiment, the detection system 12 may collect rf leakage data within an environs of the leak 12. Typically the data may be collected at a relatively high sampling rate (e.g., 20 Hz). Collection of the data may be correlated with indicia of geographic location (e.g., latitude and longitude provided by a global positioning system (GPS) receiver 24).

From the data collected by the system 10, profiles may be created of the characteristics of the rf leak 12, which relate signal strength to geographic location. From the profiles, the location of the rf leak 12 may be determined.

To further refine the localization of a leak 12, the structure of the leak 12 may be used under a two-way format. For example, it has been found that while rf energy may egress through the leak 12 and be detected by the detection system 10, it has also been found that rf energy may also ingress into the CATV system through the leak 12 from the external environment. The ingress of a signal transmitted by the system 10 may be used to further enhance localization of the leak 12.

In the context of the CATV system 30, a flaw is defined as a non-uniformity in the system 30 where rf energy can both leave (egress through leakage) and enter (ingress/cause interference within) the system 30. A flaw has a location and a set of properties, which define it as an unwanted antenna. Due to these properties it will admit or emit energy in different degrees and with different characteristics as a function of frequency.

The flaw providing the leak 12 may be considered an unconventional antenna, and as such, the path between a conventional antenna (e.g., 16) and the leak 12 may simply be considered an example of a two-way transmission path 14. In the case of egress, the CATV downstream signal being broadcast by a transmitter 32 passes through the flaw along the transmission path 14. In the case of ingress an external transmission is received through the flaw and may be detected by a receiver 34 of the system 30.

The Friis transmission formula may be used to described the power transfer between a transmitter and a receiver in free space as follows:

$$\frac{P_R}{P_T} = \frac{\lambda^2 G_T G_R}{(4\pi r)^2}, \qquad (1$$

where $\lambda$ is the wavelength of the transmission, r is the distance between transmitter and receiver, $G_T$ is the transmitter antenna gain in the direction of the receiver, $G_R$ is the receiver antenna gain in the direction of the transmitter and $P_T$ and $P_R$ are respectively the transmitted power and the received power.

In practice, it has been found that power transfer from the CATV system 30 due to rf leakage is far more complicated than what is suggested by the Friis transmission formula. The transmitted power does not arrive at the receiver exclusively by a direct path. Instead, reflected power adds or subtracts from the signal, arriving from all directions depending upon the presence of reflecting, absorbing, and re-radiating elements in the surrounding environment.

In addition to these various multi-path signals, transmitter and receiver gain terms of the respective antennas vary with direction of arrival. Thus the actual power received is the coherent summation of all possible transmission paths which terminate at the receiver. In the case of rf leakage in a CATV system, this general situation is far too complex to model. However, where rf signal propagation is considered in general, there are various situations which can be modeled and which provide insight into the general process.

Figure 2A:
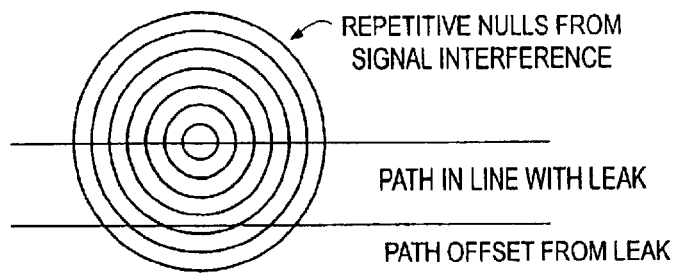
FIG. 2 depicts a ground reflection example that may be accommodated by the apparatus of FIG. 1.

FIG. 2a depicts signal paths in the case of ground reflections. It is often the case with CATV egress signals that both the transmitter and the receiver are close to the ground. Thus ground reflections at moderate grazing angles (as shown in FIG. 2a) are unavoidable.

The analysis of a ground reflection can often be facilitated by analogizing ground reflection to the light reflecting off a mirror. The conducting ground reflects the signal from the leak 12 to a receiver. Since a signal from the leak 12 may also arrive through a relatively direct path, any signal detected by a receiver is a combination of the direct path signal and a reflected signal.

Since the direct path and reflected path are not of equal length, the reflected path will have a slight phase offset with regard to the direct signal. When the reflected signal is offset by 360 degrees constructive interference will occur. When the phase offset is 180 degrees destructive interference will occur. As an observer passes through a reception area the changing distance between the observer and flaw causes a change in phase shift between the two signals. The changing pattern of constructive and destructive interference appears as a series of peaks and troughs in signal strength.

Figure 2B:
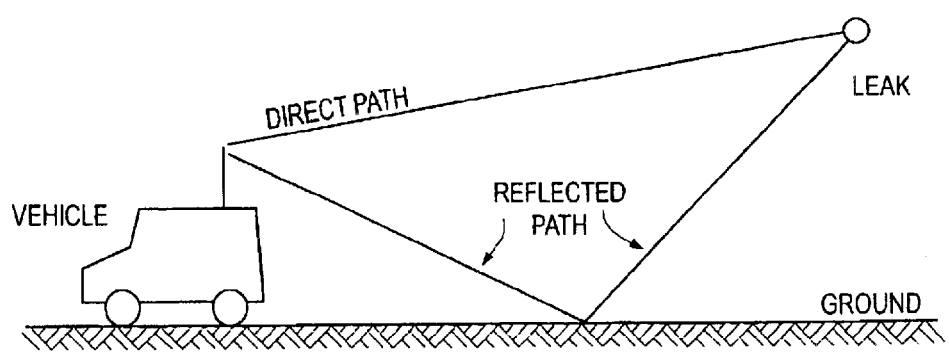

FIG. 2a illustrates the simple geometry of the ground reflection phenomena as a vehicle moves through the peaks and troughs of signal strength shown in FIG. 2b. As the vehicle moves, the antenna 16 moves through the interference field illustrated by FIG. 2b observing a sequence of peaks and troughs in signal strength as a function of the reflection coefficient and the degree to which the signal is increased and decreased by the changes in phase shift. The period of the observed amplitude variation due to ground reflections will depend upon how far the path is offset from the actual leakage source (i.e., the center of FIG. 2b). A path that intersects the leakage source will exhibit the highest frequency of peaks and troughs (as an observer moves from one side to the other), while an offset path will show lower and lower frequencies (i.e., longer periods as the path is more and more offset.

In general, as a vehicle containing the detector 10 drives past the leak 12, the detected egress energy changes rapidly because the power is controlled by the inverse square of the distance. This variation in power due to distance is the dominant or primary effect. Smaller, secondary effects give character to (impart ripples to) the signal due to constructive and destructive interference between the direct and reflected path signals, and due to details of the radiation patterns of the equivalent flaw and receiving antennas respectively.

By knowing the distance between the rings of FIG. 2b, it is possible to estimate the degree to which a signal is offset from the track of the vehicle by measuring the spatial frequency of the interference signals. The rings of FIG. 2b represents a theoretical distance to leak that may be determined from signal leakage data. In each case, the theoretical distance to leak 12 is stored as a signal profile that sampled data may be compared with. In each case a normalized signal measurement is stored in conjunction with GPS data. Alternatively, theoretical data may be adjusted for local conditions to create empirical data profiles stored in memory 26 as a set of profiles that may be matched to a particular data set. In addition, an adjusted distance to leak figure in increments of feet or meters may be provided, based on a characterized theoretical or empirical amplitude versus distance table eligible for transfer to a map, graph or chart of the geographical are under survey.

A complicating factor is the presence of more complex spatial signals due to multi-path, re-radiation, vertical reflectors such as conductive building sides, multiple leaks and the like. Each of these phenomena will be discussed in turn, although it becomes harder to invert the data set (i.e., calculate the parameter of the situation) as the geometry becomes more complex.

If antenna patterns are neglected by assuming isotropic (omnidirectional) antennas, the magnitude of the electric field from the leak 12 can be written as:

$$|E_r|^2 = \left(\frac{|E_t|\lambda}{4\pi}\right)^2 \left(\frac{1}{r_d^2} + \frac{k^2}{r_r^2} + \frac{2k}{r_d r_r}\cos\left(\frac{2\pi(r_r - r_d)}{\lambda} + \phi_0\right)\right), \quad (2$$

where $|E_r|$ and $|Et|$ are the magnitudes of the transmitted and received electric fields, respectively. The value $r_d$ may be defined by the expression, $r_d = \sqrt{d^2 + (h_t - h_r)^2}$, where d is horizontal distance, $h_t$ is height of the source (transmitter) and $h_r$ is the height of the receiver. The value $r_r$ may be defined by the expression, $r_r = \sqrt{d^2 + (h_t - h_r)^2}$ and is the reflected path distance to the receiver. The value k is a reflection coefficient, $\lambda$ is the wavelength of the radiation, $$\frac{2\pi(r_r + r_d)}{\lambda}$$

is the phase difference between the two paths, direct and reflected and $\phi_o$ is the phase change at the point of reflection. The terms $$\frac{1}{r_d^2} \text{ and } \frac{k^2}{r_r^2}$$

as well as the term multiplying the cosine term of equation 2 generate a waveform with a single maximum. The phase variation caused by the changing distances as the vehicle drives past the leak 12 can cause added structure in the signal, broadening a width of the waveform and putting ripple into it.

FIG. 3 illustrates a family of waveforms generated using the detector 10 and illustrating the concepts developed above with regard to equation 2. Each curve 50, 52, 54, 56 represents a locus of data points collected by the detector 10. In each case, the detector 10 (and vehicle) traveled along a straight line past the leak 12 collecting data at a rate of approximately 20 times per second. The abscissa represents a distance from a reference point "0". The ordinate represents a signal reading along the path of each locus of points.

The innermost lines 50 represent an energy level (signal reading) of the detector passing the fault at a lateral offset distance of 20 feet. The next set of lines 52 show the detector 10 passing the leak 12 at a distance of 30 feet. The third set of lines 54 are at 40 feet and the last set of lines 56 are at 50 feet.

In each case, the CPU 20 of the detector 10 causes a received signal strength indication (RSSI) 28 to perform a signal strength measurement on a detected signal. The CPU 20 also periodically (e.g., one per second) receives a position indication from the GPS 24. The CPU 20 receives and may store the collected information in a memory 26.

Each curve 50, 52, 54, 56 represents a leakage signal profile relating each sample with a respective geographic location. From the increasing width of the base of the curves 50, 52, 54, 56, it may be seen that the curves represent an objective indication of the distance of the leak 12 from each of the paths upon which the data was collected. More specifically, since the other variables of equation 2 remain constant, equation 2 could be solved to provide a calculated distance of the leak 12 from the path of each of the curves 50, 52, 54, 56.

The single peak shared by the curves 50, 52, 54, 56 of FIG. 3 is due to the fact that the leak 12 and the antenna 16 (for the data of FIG. 3) were only 5 feet from the ground at a frequency of 113 MHz (a wavelength of 8.71 feet). Thus the phase difference between direct and reflected paths is not significant.

Because of the proximity to the ground, the profile of the curves 50, 52, 54, 56 shows a relatively constant signal gradient related to distance. However, if the leak 12 or antenna 16 were raised vertically (or conversely if the frequency were raised proportionally), a number of interference lobes may be imposed on the curves.

Based upon a vertical height of the leak 12 and receiver 18, a peak to trough ratio of the interference lobes may be determined. If k is a reflection coefficient ($\leq 1$), the largest amplitude that the signal can acquire from constructive interference for a single ground reflection is (1+k) times the original amplitude. The smallest amplitude from destructive interference would provide would be (1-k) times the original amplitude.

The amplitude of a signal in dB may be described as follows:

$$dB_{ptt} = 20\log_{10}\left(\frac{1+k}{1-k}\right). \quad (3$$

This equation may be used to determine a worst case variation to be expected for any given reflection coefficient. For example, a 0.6 value of k (typical for ground reflection) provides a magnitude variation of 12 $dB_{ptt}$.

FIG. 4 shows a signal measurement profile for k=0.6 and the leak 12 situated 100 feet above the ground. The antenna 16 was approximately 5 feet above the ground. It should be noted from this leakage signal profile that not only can the distance of the leak 12 from the detector 10 be determined from the width of the base of the curve, but the height of the leak 12 can also be determined from the size of the lobes.

Moreover, by knowing the relationship of a peak to an adjacent trough in FIG. 4 and the ground distance between adjacent peaks, the distance to the leak 12 can be determined with a great deal of particularity. More specifically, the data of FIG. 4 may be used in conjunction with equation 3 to solve for the location of the leak 12.

The contribution of faceted reflections may be considered next. In addition to ground reflections, large expanses of metal (e.g., aluminum siding), found on the sides of many buildings provide effective reflectors. These reflectors may have reflection coefficients of 0.9 or more. At these reflection levels, multi-bounce reflections can sometimes play a role in a level of the received leakage signal.

Figure 5:
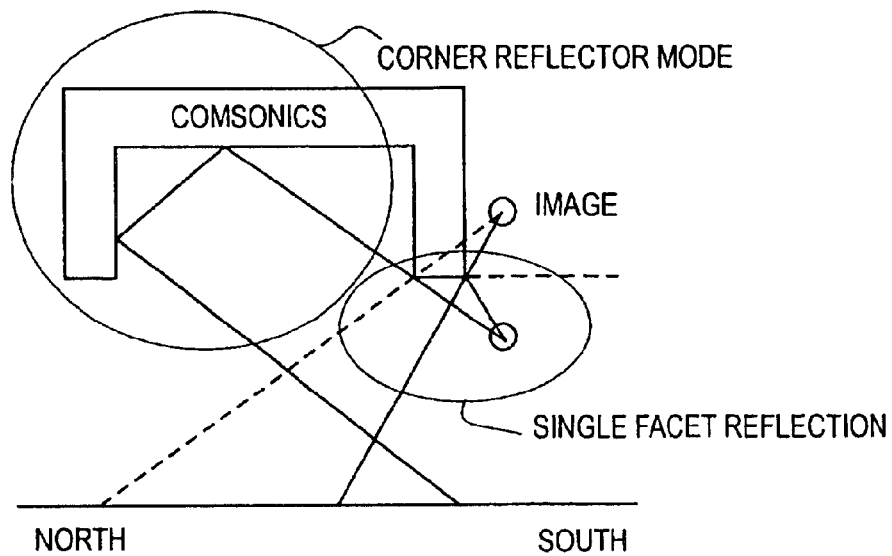
FIG. 5 depicts other forms of multi-path interference that may be processed by the system of FIG. 1.

FIG. 5 is a diagram which illustrates an example of multiple reflection modes based upon a selected building structure. In the case of faceted reflection, one can use image ideas to calculate the expected signal paths. However, the amplitude of the image will be limited by the size of the facet (reflecting area) and the visibility of the image from the line-of-sight being considered.

In FIG. 5, the front of the south side of the selected structure is the first facet encountered by the signal. It has the effect of displacing the image of the leak 12 in a northerly direction (as shown by the dotted line). The second mode illustrated is a corner reflector mode. In corner reflectors, energy is reflected off two walls that are 90 degrees apart and the energy emerges traveling in the opposite direction displaced but parallel to the incoming direction.

Faceted reflection modes produce more complex interference effects and also produce multiple images of the leak 12 distributed along the track of the detector 10 of the surveillance vehicle. These effects are often masked by the fact that the vehicle travels at different speeds as it passes a leak 12, so that even with a graph of the signal it may not be immediately evident that it arises from multiple reflections. Most leakage surveillance sampling is done at relatively slow sampling speeds. To guarantee that all interference effects are observed, it is important to sample fast enough to capture the effects of small phase changes.

Figure 6:
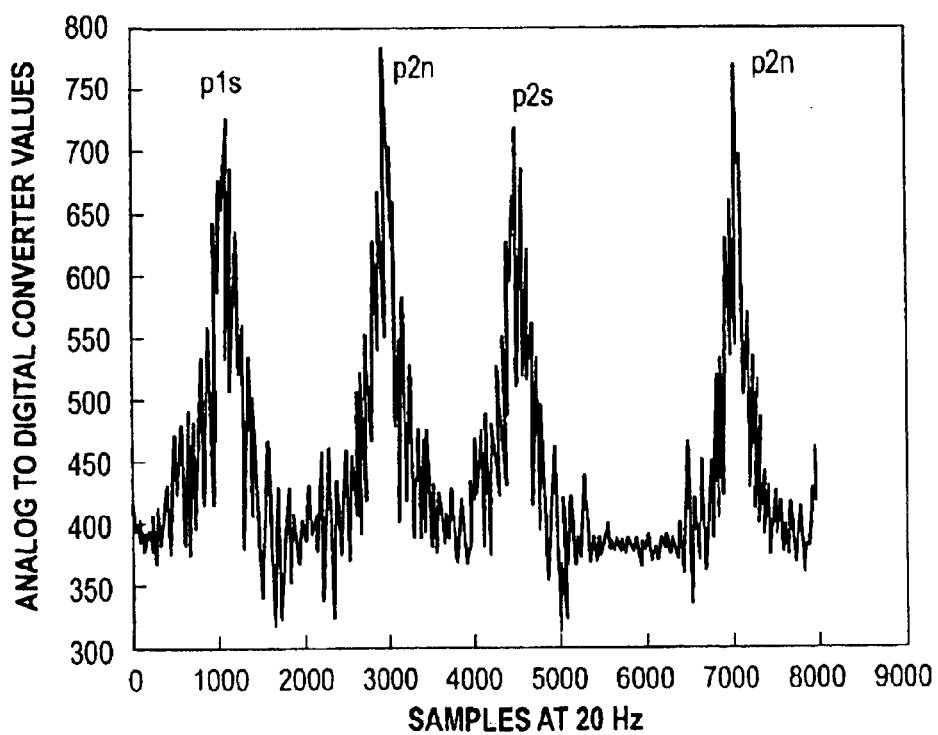
FIG. 6 depicts data collected by the system of FIG. 1.

FIG. 6 shows a sequence of leakage data including four runs past a large leak 12 intentionally inserted into a system 30. The leak 12 was located approximately 28 meter from a road running past a front of a structure. The vehicle containing the detector 10 rove past the leak 12 at varying speeds making two asses traveling south and two passes traveling north. These passes are annotated as p1s, p1n, p2s and p2n, respectively. FIG. 6 shows the raw data of the profile prior to any processing. The strong peaks vary in width from pass to pass because the vehicle drove past the leak 12 at different speeds.

Normally, one would view the spiky fine structure of FIG. 6 as noise. The data of the different runs may be compared by first normalizing the data to position. Selecting the largest value in each run as a reference point, the distance of the detector 10 to the reference point may be calculated using the GPS information. Intermediate positions may be interpolated by assuming the vehicle's speed did not change between GPS updates one a second. The data of the runs may then be compared directly.

Figure 7:
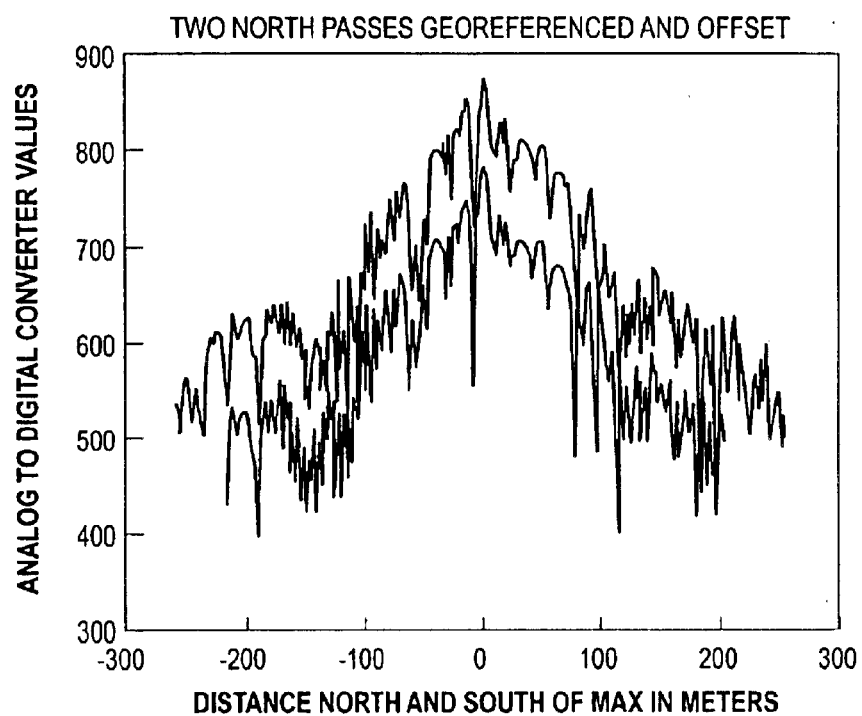
FIG. 7 depicts correlated data of the data of FIG. 6.

FIG. 7 is a direct comparison of p1n and p2n data (the two northerly runs past the leak 12). The data is plotted versus distance from the reference point in meters north and south of the peak. What is significant in FIG. 7 is that each feature in the two profiles p1n, p2n is repeated in the two runs down to a very minute level of detail. The conclusion that may be drawn is that these details are due to physical and spatial properties of the leak (and de facto antenna) and its surroundings and not due to temporal variations. Thus it should be possible to analyze signal features and draw conclusions about the leak 12 and the environment in which it is active.

The primary objective is to be able to locate the leaks 12 as precisely as possible. To accomplish this objective, one must be able to distinguish the apparent leaks caused by reflections and other signal distorting effects from the signal due to the direct path. This might be accomplished by simply picking the biggest signal except that one would need a means of telling that the next biggest signal wasn't just a reflection (with a larger value caused by constructive interference). Signal analysis methods discussed herein provide a means of making such distinctions.

Figure 8:
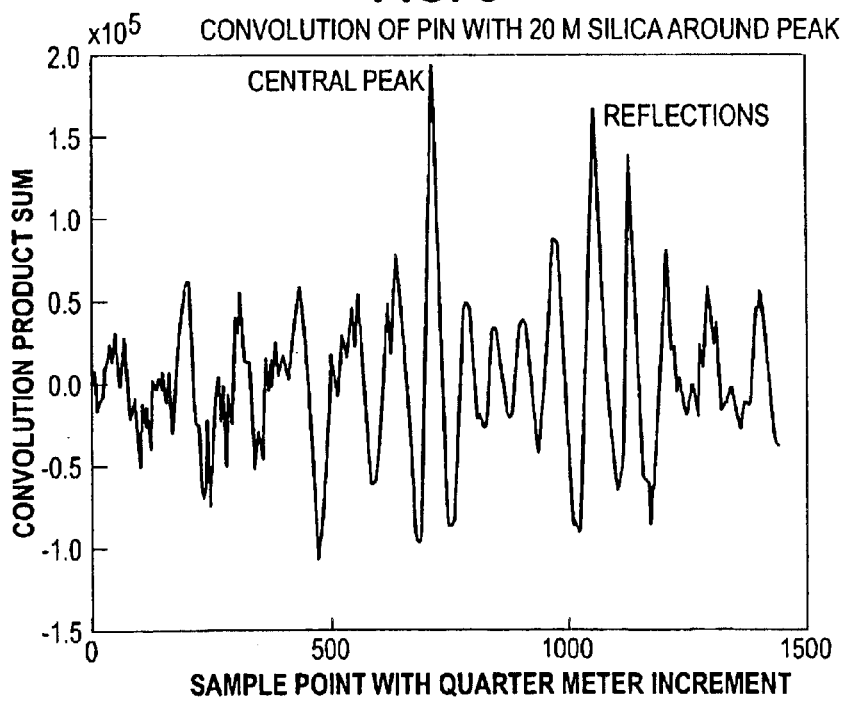
FIG. 8 depicts the convolution of data of FIG. 6.

Convolution provides one method of identifying a signal within a profile which propagated to the detector 10 over a direct path. FIG. 8 provides results obtained by convolving a slice of the largest peak of the data in FIG. 7 across the full data run. Notice the resulting peaks in the data of FIG. 8. The central peaks shows the result of the convolution when it exactly matches the peak of the data. Also shown are three image peaks which are reflections of the nearby structure.

From the data of FIG. 8 it should be clear that a leak 12 may be located based upon a number of runs past the leak 12. The peak based upon a direct path may be selected from the run with the fewest peaks and convolved with the data of the other runs to remove reflections. Directional data may then be determined from each run after reflections have been eliminated. Correlating the directional data from the multiple runs may be used as a highly effective means of locating the leak 12.

Figure 9:
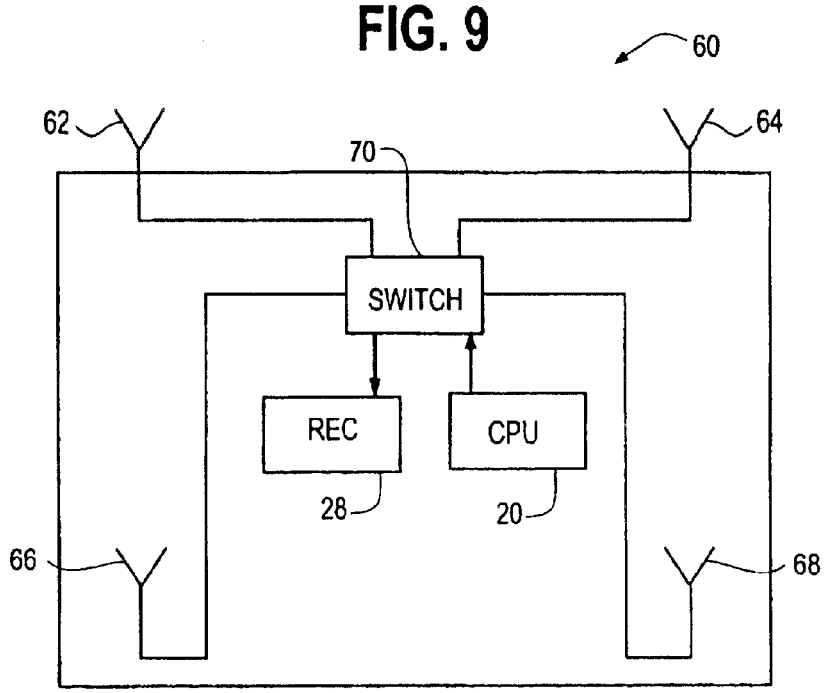
FIG. 9 depicts an alternate antenna that may be used by the system of FIG. 1.

Under another illustrated embodiment of the invention (FIG. 9) electronic signal measurement (ESM) may be used as further indicia of direction of the leak 12. As shown, the antenna 16 of FIG. 1 includes spatial diverse antenna 62, 64, 66, 68 (e.g., located on opposite corners of the vehicle 60). The spatial diverse antenna 62, 64, 66, 68 may, in turn, each be coupled to a switch 71. The switch 71, in turn, may be controlled by the CPU 20.

In operation, the CPU 20 causes the antenna 62, 64, 66, 68 to be selectively coupled to the receiver 28 where a RSSI measurement is performed through each antenna 62, 64, 66, 68. Using the RSSI measurements, a gradient of a static signal wavefront of the energy from the leak 12 may be measured. Based upon the detected gradient of the wavefront and a knowledge of the distance separating the antenna 62, 64, 66, 68, a direction of the leak 12 may be estimated.

Under another illustrated embodiment, beam forming may be used to enhance a directionality determination. Under the embodiment, a phase delay may be introduced into signals detected from the antenna 62, 64, 66, 68 of the array 70 to form a directional antenna array 70. The directionality of the antenna array 70 may be by the degree of the phase shift introduced into the signals from the various antenna 62, 64, 66, 68 using methods well known in the art.

Using beam forming techniques, the readings obtained using ESM may be verified. In fact, the combination of beam forming and ESM may be used as a further method of enhancing the accuracy of leak localization.

Under another illustrated embodiment, ingression may also be used to improve the accuracy of locating the leak 12. If the surveillance vehicle is transmitting in the return path, then ingress will take place in the neighborhood of the leak 12. The signal paths of the egress and ingress will be highly correlated in conformance with the reciprocity theorem. Since the wavelength of the ingress is generally much larger than the wavelength of egress, there will be less structure (lobes) in the ingress signal. If the transmitted ingress signal is to be modulated, information may be transmitted into the return path through the leak 12.

During the transmission interval, an ingress signal received by a receiver 34 at the hub 42 or headend location can be measured in amplitude in an RSSI 36 and phase variation. The amplitude can be further used to infer relative distance of the detector 10 from the leak 12.

Figure 10:
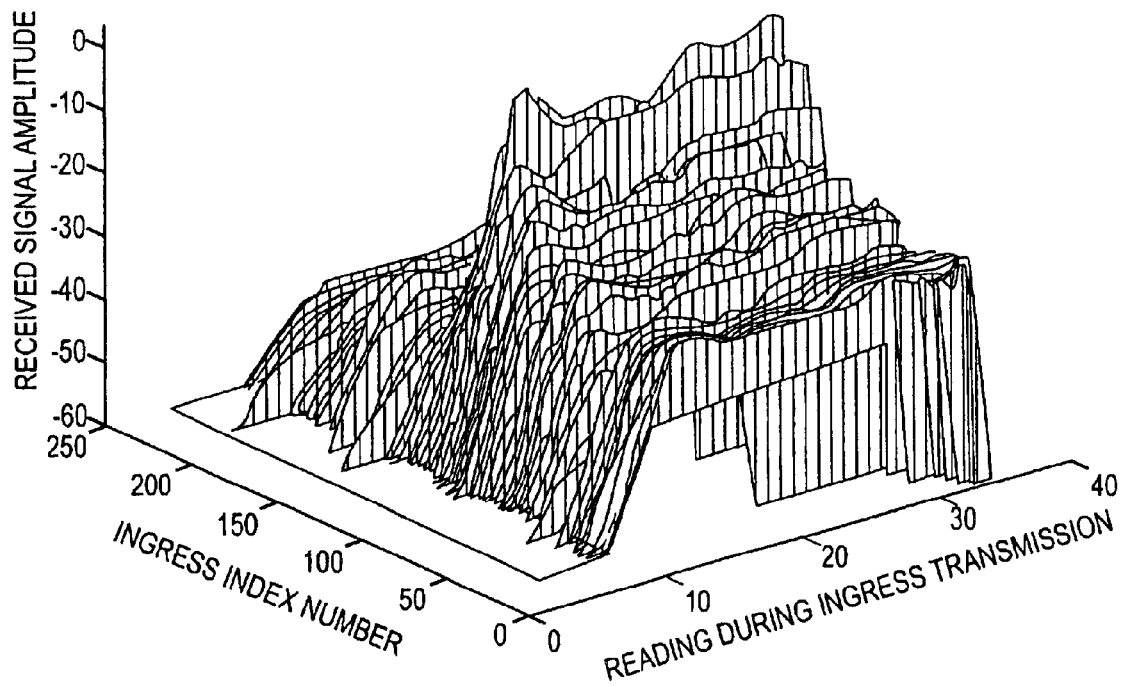
FIG. 10 depicts headend receiver readings detected by the system of FIG. 1 during ingression.

FIG. 10 depicts data collected by the receiver 34 from signals transmitted by the detector 10 during an ingression run. Data was collected at 221 sample points. Each transmission interval was triggered within the detector 10 by the GPS 24 providing a reading (i.e., once a second). GPS position data and leakage detector readings are transmitted by the transmitter 22 and received by the receiver 34 at the headend 42. During the receipt of the data, the carrier level of the signal from the transmitter 22 is measured in the RSSI detector 36. The readings are recorded with the receive position and leakage data in a memory 40. In FIG. 10, the receiver carrier levels are plotted by slice. Each interval is a few tenths of a second long and there are up to 35 readings per transmission. The readings taken in the vicinity of the ingression peak provide high density sampling.

In an alternate embodiment (FIG. 11), the antenna 16 of FIG. 1 may be an extended dipole antenna with a primary axis 15 of maximum sensitivity of energy from the leakage 12. An orientation sensor 17 is provided within a handpiece of the antenna 16 to determine an orientation of the dipole 16 (e.g., in degrees from true north).

In use, the CPU 20 of FIG. 1 would collect an orientation value from the sensor 17 along with a signal strength value from the RSSI 28. The orientation value, signal strength and location from the GPS 24 would be stored as part of a single sample reading.

Ingress coupled with egress provides not only an independent look at the leak 12, but also positively confirms that the leak 12 is in the system 30 under surveillance. The use of the ingress path also provides a means of instantly transferring the location and vehicle developed leak information to the headend 42. The use of the ingress path also provides frequency diversity, hence spatially distinct information about the geometry of the leak 12.

Collecting egress and ingress information within the database 40 allows a diversity of sampling profiles that further improves upon localization of the leak 12. The use of different frequencies on the egress and ingress paths allows multi-path interference to factored out of the respective sampling profiles, thereby significantly improving the ability of the system to localize leaks.

The further improve on the above strategies, a further compounding of methods may be used. First, events may be isolated which may be leaks using leak-fitting methods (a group of specialized basis functions in a linear vector space). An event analysis may be performed on each event to assign attributes to the events. Events may be clustered which are spatially near one another and create cluster zones that may be related to a single leak 12. The analysis may be performed in a time sequential, adaptive manner to minimize time-late effects.

In an alternate embodiment of the invention, the leak detection system is divided among components located in a moving vehicle and components located at the headend. A leak detector may be located in the moving vehicle and may include the receiver 18, transmitter 22, CPU 20 and GPS 24. The data collected from the moving vehicle may be transceived with the headend via the leak using the Ethernet, Bluetooth, or other similar transmission protocol.

A host 38 located at the head end 30 may receive the transceived data and perform the functions of correlation, profiling, peak detection and distance determination. Based upon the GPS data transceived along with the sampled data, the headend host may plot a leak location on a geographic map.

In another embodiment of the invention, the leak detector within the moving vehicle may also include the use of inertial or magnetic navigational devices to provide a directional bearing of the leak. The directional bearing may be incorporated with the leak detector as further indicia of the location of the source of the leak.

A specific embodiment of a method and apparatus for locating leaks in a CATV system according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of determining a source of a leakage signal from a distribution cable of a community antenna television distribution system, such method comprising the steps of:
   providing a plurality of theoretical signal profiles that each relate theoretical leakage signals to source locations by distance;
   sampling the leakage signal from the distribution cable of the community antenna television distribution system at each of a plurality of geographic locations within an environs of the cable;
   matching the sampled leakage signals with a theoretical signal profile of the plurality of theoretical signal profiles; and
   determining a source location of where the leakage signals leak from the distribution cable based upon the matched theoretical signal profile.

2. The method of detecting a leakage signal as in claim 1 further comprising measuring a gradient of energy of the leakage signal in a spatial field at each sample location.

3. The method of detecting a leakage signal as in claim 2 further comprising determining a relative source direction of the signal at each sample location based upon the gradient of energy of the leakage signal in the spatial field at each sample location.

4. The method of detecting a leakage signal as in claim 3 further comprising determining the source location of the signal based upon a triangulation of the relative source directions.

5. The method of detecting a leakage signal as in claim 1 wherein the step of sampling the leakage signal at a plurality of locations further comprises selecting the locations along a relatively straight line.

6. The method of detecting a leakage signal as in claim 5 further comprises forming a bell-curve of samples along the relatively straight line.

7. The method of detecting a leakage signal as in claim 6 wherein the step of selecting the locations along a relatively straight line further comprises identifying a highest relative magnitude sample of the samples of the bell-curve.

8. The method of detecting a leakage signal as in claim 7 further comprising correlating leakage samples with readings from a global positioning sensor.

9. The method of detecting a leakage signal as in claim 1 wherein the step of determining a source location further comprises rejecting reflections.

10. The method of detecting a leakage signal as in claim 1 wherein the step of determining a source location further comprises determining a relative height of the source from the ground by measuring a relative height of interference lobes in the leakage signal profile.

11. An apparatus for determining a source of a leakage signal from a distribution cable of a community antenna television distribution system, such apparatus comprising:
    a plurality of theoretical signal profiles that relate theoretical leakage signals to source locations by distance;
    means for sampling the leakage signal from the distribution cable of the community antenna television distribution system at each of a plurality of geographic locations within an environs of the cable;
    means for matching the signals sampled by the means for sampling with a theoretical signal profile of the plurality of profiles; and
    means for determining a source location of where the leakage signals leak from the distribution cable based upon the matched theoretical profile.

12. The apparatus for detecting a leakage signal as in claim 11 further comprising means for measuring a gradient of energy of the leakage signal in a spatial field at each sample location.

13. The apparatus for detecting a leakage signal as in claim 12 further comprising means for determining a relative source direction of the signal at each sample location based upon the gradient of energy of the leakage signal in the spatial field at each sample location.

14. The apparatus for detecting a leakage signal as in claim 13 further comprising means for determining the source location of the signal based upon a triangulation of the relative source directions.

15. The apparatus for detecting a leakage signal as in claim 11 wherein the means for sampling the leakage signal at a plurality of locations further comprises means for selecting the locations along a relatively straight line.

16. The apparatus for detecting a leakage signal as in claim 15 further comprises means for forming a bell-curve of samples along the relatively straight line.

17. The apparatus for detecting a leakage signal as in claim 16 wherein the means for selecting the locations along a relatively straight line further comprises means for identifying a highest relative magnitude sample of the samples of the bell-curve.

18. The apparatus for detecting a leakage signal as in claim 17 further comprising means for correlating leakage samples with readings from a global positioning sensor.

19. The apparatus for detecting a leakage signal as in claim 11 wherein the means for determining a source location further comprises means for rejecting reflections.

20. The apparatus for detecting a leakage signal as in claim 11 wherein the means for determining a source location further comprises means for determining a relative height of the source from the ground by measuring a relative height of interference lobes in the leakage signal profile.

21. An apparatus for determining a source of a leakage signal from a distribution cable of a community antenna television distribution system, such apparatus comprising:
    a plurality of theoretical signal profiles that relate theoretical leakage signals to source locations by distance;
    a signal detector adapted to sample the leakage signal from the distribution cable of the community antenna television distribution system at each of a plurality of geographic locations within an environs of the cable;
    a sample processor adapted to match the sampled leakage signals with a theoretical signal profile of the plurality of theoretical signal profiles; and
    a locator processor adapted to determine a source location of where the leakage signals leak from the distribution cable based upon the matched theoretical profile.

22. The apparatus for detecting a leakage signal as in claim 21 further comprising a gradient processor adapted to measure a gradient of energy of the leakage signal in a spatial field at each sample location.

23. The apparatus for detecting a leakage signal as in claim 22 further comprising an antenna array adapted to determine a relative source direction of the signal at each sample location based upon the gradient of energy of the leakage signal in the spatial field at each sample location.

24. The apparatus for detecting a leakage signal as in claim 22 further comprising an antenna array adapted to determine a relative source direction of the signal based upon a phase shift introduced into a signal detected at each antenna of the antenna array.

25. The apparatus for detecting a leakage signal as in claim 22 further comprising an antenna array adapted to determine a relative source direction of the signal based upon both gradient of energy of the leakage signal and a phase shift introduced into a signal detected at each antenna of the antenna array.

26. The apparatus for detecting a leakage signal as in claim 23 further comprising a correlation processor adapted to determine the source location of the signal based upon a triangulation of the relative source directions.

27. A method of calculating distance between a moving vehicle acquiring data through an antenna attached to a detection device and an rf leak from a distribution cable of a CATV communication system, such method comprising the steps of:
    providing a plurality of theoretical signal profiles that relate theoretical leakage signals to source locations by distance;
    acquiring sample data characterizing the rf leak using the detection device;
    rejecting reflected artifacts of the rf leak being detected contained within the acquired data;
    correlating simultaneously collected GPS or differential GPS terrestrial location data with the acquired sample data;
    matching the correlated location data and sample data with a theoretical signal profile of the plurality of theoretical signal profiles; and
    providing an adjusted distance to a location of the rf leak in increments of feet or meters, from the matched theoretical signal profile for transfer to a map, graph or chart of the geographical area under survey where the rf leak is a source location on the distribution cable where an rf signal leaks from the distribution cable.

28. An apparatus for calculating distance between a moving vehicle and an rf leak from a distribution cable of a CATV communication system, such apparatus further comprising:
    a plurality of theoretical signal profiles that relate theoretical leakage signals to source locations by distance;
    a leak detection device mounted on the moving vehicle and adapted to acquire sample data characterizing the rf leak;
    a global positioning system;
    a central processing unit coupled to the leak detection device and global positioning system, such central processing unit further comprising:
        a peak detector receiving data from the leak detection device and adapted to identify a relative peak by rejecting reflected artifacts of the rf leak within the acquired data;
        a correlator adapted to generate leakage signal profiles by correlating the sampled data and the correlated peak to geographic locations provided by the global positioning system and for matching the correlated peaks to a theoretical signal profile of the plurality of theoretical signal profiles; and
        a distance detector adapted to discern a distance to a location of the rf leak from the vehicle based upon the matched theoretical signal profile, where the rf leak is a source location on the distribution cable where an rf signal leaks from the distribution cable.

29. The apparatus for calculating distance as in claim 28 further comprising an output port on the central processing unit adapted for transfer of assembled data to permanent storage media or a central computer for purposes of further processing or incorporation with a geographical map or other maintenance or diagnostic tools.

30. The apparatus for calculating distance as in claim 28 wherein the apparatus further comprises a modular construction including modularly separate global positioning system and leak detector components.

31. An apparatus for calculating distance between a leak detection apparatus and an rf leak from a distribution cable of a CATV communication system, such apparatus further comprising:
    a plurality of theoretical signal profiles that relate theoretical leakage signals to source locations by distance;
    a leak detection device with a distance display and adapted to acquire sample data characterizing the rf leak;
    a central processing unit with a storage media coupled to the leak detection device, such central processing unit further comprising:

a peak detector receiving data from the leak detection device and adapted to identify a relative peak by rejecting reflected artifacts of the rf leak within the acquired data;

a correlator adapted to generate leakage signal profiles; and a distance detector adapted to discern a distance to the leak based upon a comparison of the plurality of theoretical signal profiles and the generated leakage signal profiles, wherein the rf leak is a source location on the distribution cable where the leakage signal leaks from the distribution cable, and wherein said central processing unit and storage media is shared among the leak detection device, peak detector, correlator and distance detector.

32. The apparatus for calculating distance as in claim 31 further comprising an input port adapted for connection of a global positioning system receiver.

33. The apparatus for calculating distance as in claim 31 further comprising the global positioning system receiver coupled to the input port.

34. The apparatus for calculating distance as in claim 33 further comprising a host computer adapted to receive sample data from the apparatus for calculating distance and to incorporate the sample data into a geographic map.

35. The apparatus for calculating distance as in claim 34 wherein the host computer further comprises a portable processor coupled to the apparatus for calculating distance.

36. The apparatus for calculating distance as in claim 35 further comprising a display on the leak detection device and adapted to display distance and global positioning system data.

37. The apparatus for calculating distance as in claim 36 wherein the leakage detection device further comprises a transceiver adapted to transceive distance and position between the host computer and apparatus for calculating distance via Ethernet, Bluetooth or similar transmission protocols.

38. The apparatus for calculating distance as in claim 37 wherein the host processor further comprises a processor located at a headend of the CATV communication system and adapted to receive its raw data as a result of signals transmitted from the apparatus for calculating distance through the rf leak in the CATV communication system and carried to the headend on an upstream portion of a CATV system spectrum where post-detection processing occurs.

39. The apparatus for calculating distance as in claim 37 wherein the apparatus for calculating distance further comprises a storage media coupled to the leak detection device and central processing unit and upon which resides peripheral device control software and processing algorithms necessary for discerning isolation of primary leakage source and assignation of distance to leak as derived from embedded theoretical or empirical amplitude versus distances tables and correlation to action sampling time-frame global positioning system data.

40. The apparatus for calculating distance as in claim 39 wherein the storage media further comprises an output port for transfer of assembled data to permanent storage media or a central computer for purposes of further processing or incorporation with a geographical map or other maintenance or diagnostic tools.

41. The apparatus for calculating distance as in claim 40 further comprising a roof-mounted high-speed switching antenna array adapted to provide empirical data based on a maximum sensitivity of a primary leakage signal detected thereby allowing a computation of directional bearing to be incorporated with distance calculations.

42. The apparatus for calculating distance as in claim 40 further comprising one of inertial and navigational device adapted to provide directional bearing information for inclusion with the distance calculation which may be displayed on the display.

43. The apparatus for calculating distance as in claim 31 wherein the leak detection apparatus further comprising the leak detection device and the leak detection device transceives the acquired sample data with the central processing unit located at a headend of the CATV system via Ethernet, Bluetooth or some other similar wireless transmission protocol.

* * * * *